(12) United States Patent
Kenjo et al.

(10) Patent No.: US 6,304,079 B1
(45) Date of Patent: Oct. 16, 2001

(54) INCREMENTAL ROTARY ENCODER FOR MEASURING HORIZONTAL OR VERTICAL ANGLES

(75) Inventors: Katsuhiko Kenjo, Tokyo; Masami Shirai, Saitama, both of (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/559,758

(22) Filed: Apr. 27, 2000

(30) Foreign Application Priority Data

Apr. 28, 1999 (JP) ................................... 11-123076

(51) Int. Cl.⁷ ..................................................... G01B 7/30
(52) U.S. Cl. ................. 324/207.21; 324/207.25
(58) Field of Search ........................... 324/207.12, 207.2, 324/207.21, 207.25, 252; 338/32 R, 32 H; 33/290; 702/151, 145, 146

(56) References Cited

U.S. PATENT DOCUMENTS

5,216,480  6/1993  Kaneko et al. ....................... 356/152

*Primary Examiner*—Jay Patidar
(74) *Attorney, Agent, or Firm*—Greenblum & Bernstein, P.L.C.

(57) ABSTRACT

An incremental rotary encoder outputs two sine wave signals having a phase difference of 90 degrees when the incremental rotary encoder is in operation, the incremental rotary encoder including a binary coding circuit which codes each of the two sine wave signals into a binary signal, a voltage detector which detects the voltage of one of the two sine wave signals at the moment of variation in a signal level of the binary signal, and a controller which includes a calculator which takes an even number of voltage values from each of the two sine wave signals to take an average of the even number of voltage values for each of the two sine wave signals.

10 Claims, 9 Drawing Sheets

INCREMENTAL ROTARY ENCODER FOR MEASURING HORIZONTAL OR VERTICAL ANGLES

BACKGROUND OF THE INVENTION

1. Field of the Invention

The present invention relates to an incremental rotary encoder which is suitable for surveying instruments such as total stations, theodlites, or the like.

2. Description of the Related Art

Surveying instruments such as total stations, theodlites, or the like, in recent years are provided with an incremental rotary encoder as an angle measuring device for measuring horizontal or vertical angles. This angle is calculated using the sum of a first angle value (counter value) and a second angle value (interpolation value). Two signals of sine and cosine waves (sin θ, cos θ) having a phase difference of 90 degrees therebetween which are output from the sensors of the incremental rotary encoder when it is in operation are each coded into a binary signal with reference to a corresponding reference voltage to obtain the aforementioned first and second angle values. The counter value is obtained by counting the points of variation in the signal level of each of the binary coded signals, while the interpolation value is obtained by dividing a section between two adjacent points of variation in the signal level of the binary coded signal.

The interpolation value is calculated in accordance with the variation of the oscillation from the constant reference voltage. Therefore, if the median voltage of each sine wave signal deviates from the reference voltage thereof, the interpolation value is not precisely calculated, thereby including error.

Figure 5:
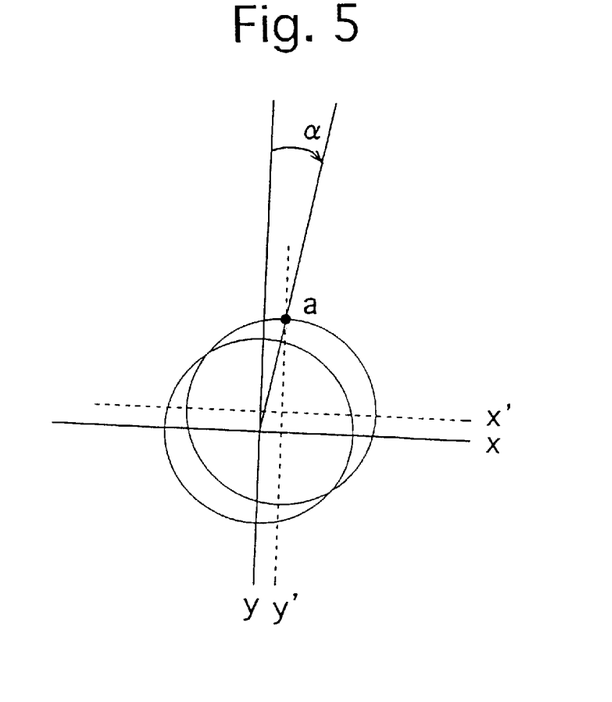
FIG. 5 is a Lissajous figure of a sine wave signal output from a magnetic sensor of the incremental rotary encoder shown in FIGS. 1 and 2, explaining about an error of the interpolation value which occurs when the median voltage of the magnetic sensor is different from a reference voltage.

This error will be hereinafter discussed in detail with reference to FIG. 5. In FIG. 5 it is assumed that Lissajous circle of either the sine or cosine wave that rotates about the intersecting point of the x-axis and the y-axis (each shown by solid lines) of a reference voltage deviates from the intersecting point to rotate about the intersecting point of the x'-axis and the y'-axis (each shown by dotted lines) of a median voltage. In this state, a point "a" on the deviated Lissajous circle has no declination relative to the y'-axis of the median voltage but has a declination "α" relative to the y-axis of the reference voltage. This declination "α" causes an error in an interpolative calculation for calculating the interpolation value.

Since the interpolation value is obtained by dividing an angle corresponding to one count of the aforementioned counter value, the influence of the voltage difference on the error of the interpolation value becomes greater the lesser the number of pulses per revolution of the incremental rotary encoder (i.e., as the angle per one count is greater).

SUMMARY OF THE INVENTION

An object of the present invention is to provide an incremental rotary encoder which makes it possible to reduce error in the interpolation value by adjusting the aforementioned median voltage that is used to process the phase difference signals which are output from the incremental rotary encoder when the incremental rotary encoder is in operation.

To achieve the object mentioned above, according to an aspect of the present invention, an incremental rotary encoder is provided which outputs two sine wave signals having a phase difference of 90 degrees when the incremental rotary encoder is in operation, the incremental rotary encoder including a binary coding circuit which codes each of the two sine wave signals into a binary signal; a voltage detector which detects the voltage of one of the two sine wave signals at the moment of variation in a signal level of the binary signal of the other of the two sine wave signals; and a controller including a calculator which takes an even number of voltage values detected by the voltage detector to generate an average of the even number of voltage values for each of the two sine wave signals.

Preferably, the calculator calculates a median voltage of each of the two sine wave signals in accordance with the average of the even number of voltage values, and performs an interpolative calculation in accordance with the detected voltage and the median voltage to calculate an interpolation rotational angle for the incremental rotary encoder.

The incremental rotary encoder further includes a rotary portion, a sensor which outputs two sine wave signals having a phase difference of 180 degrees with respect to each respective said two sine wave signals having a phase difference of 90 degrees, and a differential amplifier which amplifies a difference between the two sine wave signals having the phase difference of 180 degrees.

According to an embodiment, the calculator performs the interpolative calculation using the following equations (1) and (2):

$$X = X - V_{C(COS)} \text{ and}$$
$$Y = Y - V_{C(SIN)} \ldots (1);$$
$$\theta = \tan^{-1}(y/x) \ldots (2);$$

wherein "X" and "Y" designate the voltages of the two sine wave signals of the SIN and COS signals, respectively; "$V_C$" designates the medium voltage; and "θ" represents the interpolation rotational angle.

Preferably, the incremental rotary encoder further includes a non-volatile memory. The median voltages $V_{C(SIN)}$ and $V_{C(COS)}$ are stored in advance in the non-volatile memory the and the controller reads out the stored values of the median voltages $V_{C(SIN)}$ and $V_{C(COS)}$ from the non-volatile memory to perform the interpolative calculation.

According to another aspect of the present invention, an incremental rotary encoder, which outputs two sine wave signals having a phase difference of 90 degrees when the incremental rotary encoder is in operation, includes a binary coding circuit which codes each of the two sine wave signals into a binary signal, a voltage detector which detects the voltage of one of the two sine wave signals at the moment of variation in a signal level of the binary signal of the other of the two sine wave signals, a controller comprising a calculator which takes an even number of voltage values detected by the voltage detector to generate an average of the even number of voltage values for each of the two sine wave signals, and a closed-loop circuit which compares the average voltage with a predetermined target voltage to bring the average voltage close to the predetermined target voltage.

Preferably the incremental rotary encoder further includes a rotary portion, a sensor which outputs two sine wave signals having a phase difference of 180 degrees with respect to each respective one of the two sine wave signals having a phase difference of 90 degrees, and a differential amplifier which amplifies a difference between the two sine wave signals having a phase difference of 180 degrees. The closed-loop circuit adjusts an offset voltage of the differential amplifier so that the average voltage coincides with the predetermined target voltage.

Preferably, the incremental rotary encoder further includes a non-volatile memory. The adjusted offset voltage is stored in advance in the non-volatile memory when the power is OFF, and the controller reads out the stored offset voltage from the non-volatile memory to adjust the voltage values X and Y, detected by the voltage detector, when the power is ON.

Preferably, the incremental rotary encoder further includes a magnetic drum, and first and second magnetic sensors arranged so as to be opposite from each other with respect to the axis of the magnetic drum.

According to another aspect of the present invention, a surveying instrument is provided which includes a leveling board; a pedestal coupled to the leveling board to be rotatable about a vertical axis relative to the leveling board; a collimating telescope coupled to the pedestal to be rotatable about a horizontal axis relative to the pedestal; a horizontal-angle measuring device for measuring an angle of rotation of the pedestal relative to the leveling board; and a vertical-angle measuring device for measuring an angle of rotation of the collimating telescope relative to the pedestal. At least one of the horizontal-angle measuring device and the vertical-angle measuring device includes an incremental rotary encoder, and the incremental rotary encoder includes a rotary portion, a first sensor and a second sensor; the first and second sensors being arranged so as to be opposite from each other with respect to the axis of the rotary portion. The incremental rotary encoder outputs two sine wave signals having a phase difference of 90 degrees when the incremental rotary encoder is in operation. The incremental rotary encoder includes a binary coding circuit which codes each of the two sine wave signals into a binary signal, a voltage detector which detects the voltage of one of the two sine wave signals at the moment of variation in a signal level of said binary signal of the other of said two sine wave signals, and a calculator which takes an even number of voltage values from each of the two sine wave signals to take an average of the even number of voltage values for each of the two sine wave signals.

The present disclosure relates to subject matter contained in Japanese Patent Application No.11-123076 (filed on Apr. 28, 1999) which is expressly incorporated herein by reference in its entireties.

BRIEF DESCRIPTION OF THE DRAWINGS

The present invention will be discussed below in detail with reference to the accompanying drawings, in which.

DESCRIPTION OF THE PREFERRED EMBODIMENTS

Figure 1:
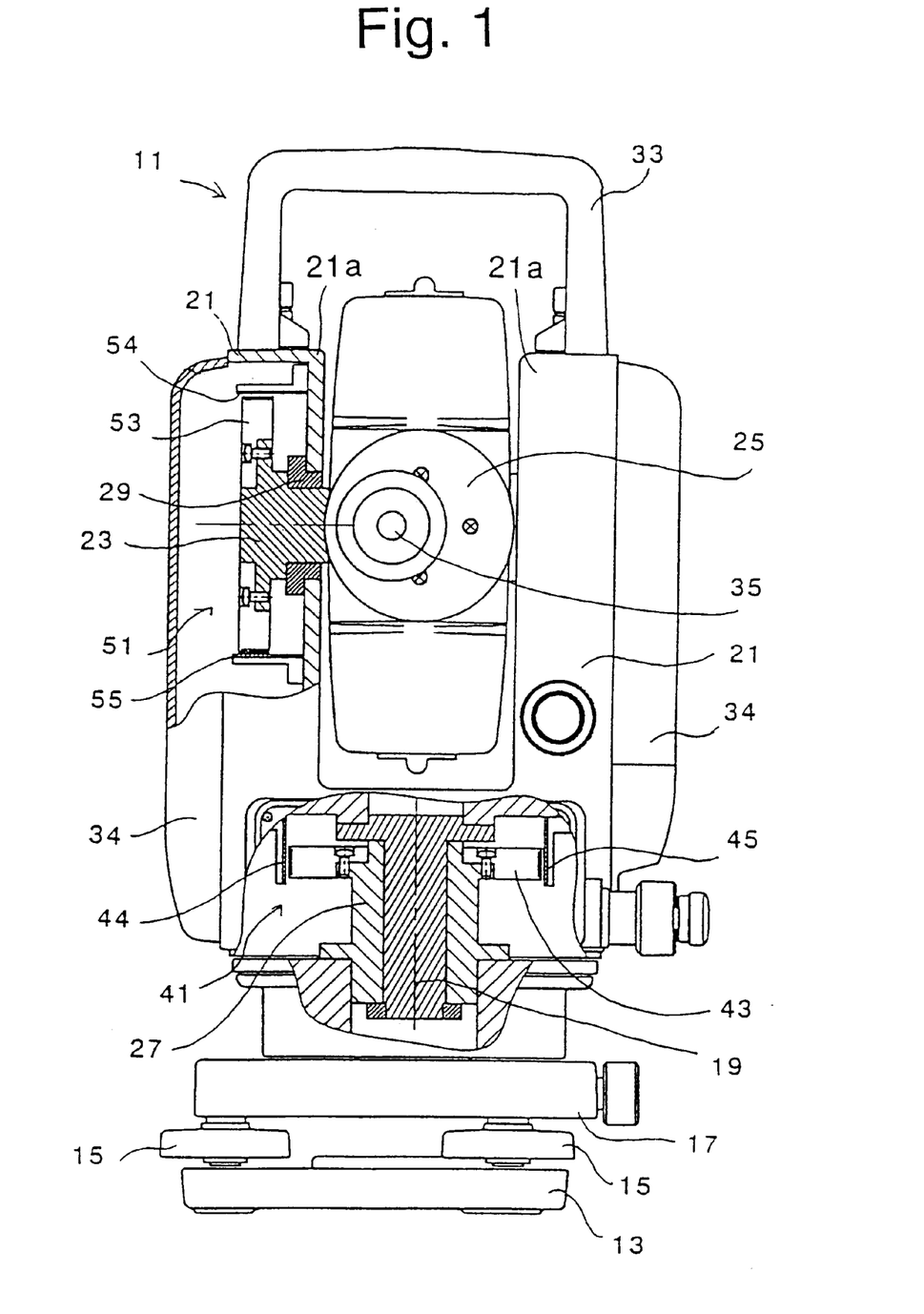
FIG. 1 is a rear elevational view of the first embodiment of a total station which incorporates two magnetic incremental rotary encoders to which the present invention is applied, showing fundamental elements of each magnetic incremental rotary encoder in cross section.
Figure 2:
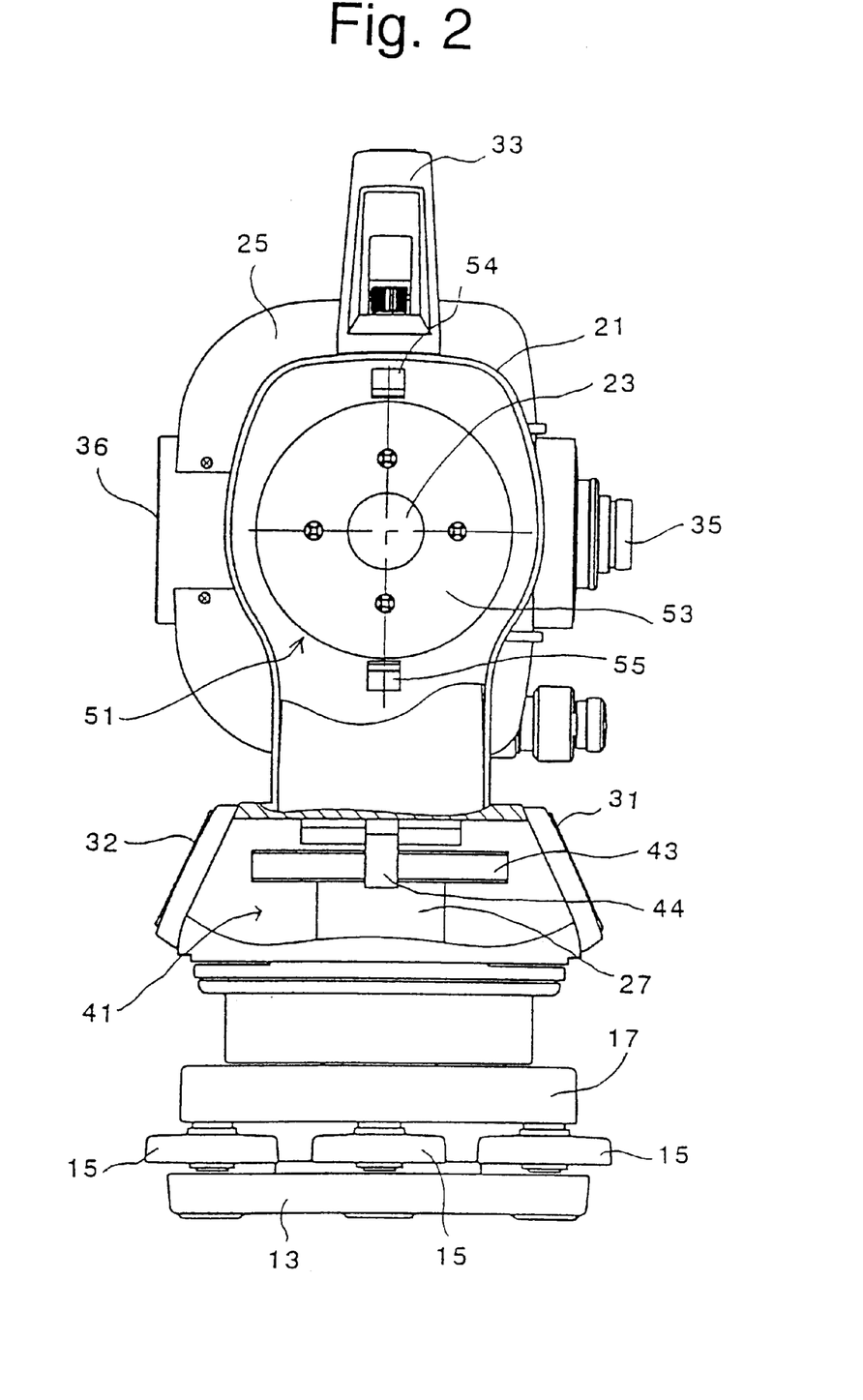
FIG. 2 is a side elevational view of the total station shown in FIG. 1, showing fundamental elements of each magnetic incremental rotary encoder in cross section.

FIGS. 1 and 2 show the first embodiment of a total station (including an optical instrument) which incorporates two magnetic incremental rotary encoders.

The total station 11 is provided with a base plate 13, a leveling board 17, a pedestal 21 and a collimating telescope 25. The base plate 13 is connected to a tripod (not shown) when the total station 11 is mounted thereon. The base plate 13 is provided thereon with three leveling screws 15 on which the leveling board 17 is mounted. The pedestal 21 is mounted on the leveling board 17 via a vertical shaft 19 to be rotatable about the vertical shaft 19. The pedestal 21 is formed so as to have a general U-shaped cross section, and has a pair of supports 21a positioned on right and left sides as viewed in FIG. 1. The collimating telescope 25 is held by the pair of supports 21a therebetween to be rotatable about the axis of a pair of coaxial horizontal shafts 23 which are fixed to the right and left sides of the collimating telescope 25 as viewed in FIG. 1. The pair of coaxial horizontal shafts 23 are respectively supported by the pair of supports 21a to be rotatable about the axis thereof. In FIG. 1 only one of the pair of coaxial horizontal shafts 23 (the left shaft 23 as viewed in FIG. 1) is shown (in cross section).

The vertical shaft 19 is rotatably fitted in, and supported by, a vertical bearing 27 which is fixed to the leveling board 17. The base of the pedestal 21 which connects the pair of supports 21a is fixed to the upper end of the vertical shaft 19. Each horizontal shaft 23 is rotatably supported by a corresponding horizontal bearing 29 fixed to the corresponding support 21a. The collimating telescope 25 is fixed to each horizontal shaft 23.

The total station 11 is provided on the vertical shaft 19 with a first magnetic incremental rotary encoder (first rotary encoder/horizontal-angle measuring device) 41 adapted for measuring the angle of rotation (horizontal angle) of the vertical shaft 19 (the pedestal 21 and the collimating telescope 25) with respect to the leveling board 17. The total station 11 is further provided on the horizontal shaft 23 with a second magnetic incremental rotary encoder (second rotary encoder/vertical-angle measuring device) 51 adapted for measuring the angle of rotation (vertical angle) of the horizontal shaft 23 (the collimating telescope 25) with respect to the pedestal 21. The first rotary encoder 41 is provided with a magnetic drum (rotary portion) 43 fixed to the vertical shaft 19. The magnetic drum 43 is provided on the outer peripheral surface thereof with a multi-pole magnetized layer (not shown). The first rotary encoder 41 is further provided with two magnetic sensors 44 and 45 which are positioned to face the multi-pole magnetized layer with a slight gap between each magnetic sensor and the multi-pole magnetized layer on the opposite sides of the magnetic drum 43 (the right and left sides of the magnetic drum 43 as viewed in FIG. 1) with respect to the vertical shaft 19. The two magnetic sensors 44 and 45 are offset from each other by approximately 180 degrees about the vertical shaft 19. Likewise, the second rotary encoder 51 is provided with a magnetic drum (graduator disc/rotary portion) 53 fixed to the horizontal shaft 23. The magnetic drum 53 is provided on the outer peripheral surface thereof with a multi-pole magnetized layer 53a (see FIG. 3) which is identical to the multi-pole magnetized layer of the magnetic drum 43. The second rotary encoder 51 is further provided with two magnetic sensors 54 and 55 which are positioned to face the multi-pole magnetized layer 53a with a slight gap between each magnetic sensor and the multi-pole magnetized layer 53a on opposite sides of the magnetic drum 53 (the upper and lower sides of the magnetic drum 53 as viewed in FIG. 1) with respect to the horizontal shaft 23. The two magnetic sensors 54 and 55 are offset from each other by approximately 180 degrees about the horizontal shaft 23.

Although the details are not shown in the drawings, the total station 11 is provided in the base of the pedestal 21 with an electronic circuit (see FIG. 6) which includes an operational means for determining the angle of rotation of each of the first and second rotary encoders 41 and 51 (i.e., horizontal and vertical angles) by detecting the output voltage of each of the magnetic sensors 44, 45, 54 and 55. The total station 11 is provided on the front and rear faces of the pedestal 21 with operational panels 31 and 32, respectively (see FIG. 2). Each of the operational panels 31 and 32 is provided thereon with a keyboard which is manually operated by an operator to operate and control the total station 11, and a display (e.g., an LCD panel) for indicating the data input by the keyboard, the measured angles, etc.

As shown in FIGS. 1 and 2, the total station 11 is further provided with a grip 33 which is gripped when the total station 11 is carried, and a protection cover 34 which covers the pedestal 21 to protect the first rotary encoder 41 and battery (not shown) from dust. The collimating telescope 25 is provided with an objective lens 36 (see FIG. 2) and an eyepiece 35 (see FIG. 1).

Figure 3:
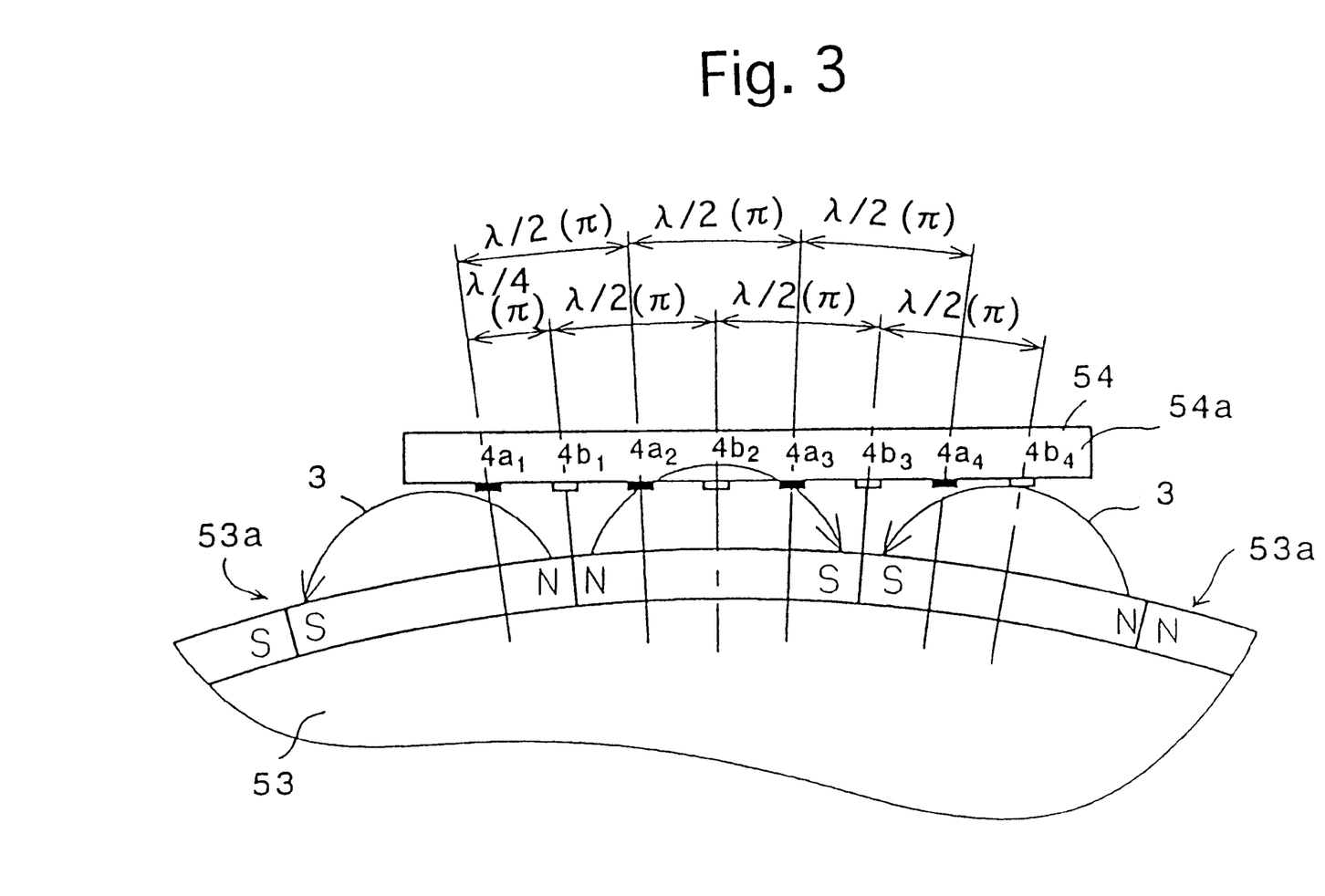
FIG. 3 is an explanatory view of a fundamental portion of the magnetic incremental rotary encoder shown in FIGS. 1 and 2, showing a relation between a magnetic sensor and the multi-pole magnetized layer of a magnetic drum.

The structure of each of the first and second rotary encoders 41 and 51 will be hereinafter discussed in detail with reference to FIGS. 3 and 4. The fundamental structure of the first rotary encoder 41 is identical to that of the second rotary encoder 51, so that only the structure of the second rotary encoder 51 will be hereinafter discussed in detail. FIG. 3 is an explanatory view of the magnetic sensor 54 and part of the magnetic drum 53, showing a relation between the multi-pole magnetized layer 53a of the magnetic drum 53 and the magnetic sensor 54.

The second rotary encoder 51 is provided, on an outer peripheral surface of the magnetic drum 53 thereof, with the multi-pole magnetized layer 53a having a plurality of magnetized divisions equally divided by the number of divisions N ("N" being a positive integer). The pitch of the magnetized divisions (i.e., the pitch of two adjacent borders of the magnetic poles) of the multi-pole magnetized layer 53a is herein assumed to be "$\lambda$". The first magnetic sensor 54 is positioned to face the multi-pole magnetized layer 53a with a slight gap between the first magnetic sensor 54 and the multi-pole magnetized layer 53a. The first magnetic sensor 54 is provided with a plane board 54a and eight magnetoresistor elements $4a_1$, $4a_2$, $4a_3$, $4a_4$, $4b_1$, $4b_2$, $4b_3$ and $4b_4$. These eight magnetoresistor elements are located at $\lambda/4$ intervals on that surface of the plane board 54a which faces the multi-pole magnetized layer 53a so that the straight line which substantially perpendicularly penetrates through the center of each magnetoresistor element passes through the rotational axis of the magnetic drum 53.

If the magnetic drum 53 rotates, the second rotary encoder 51 detects the variation of the resistance values of the eight magnetoresistor elements $4a_1$, $4a_2$, $4a_3$, $4a_4$, $4b_1$, $4b_2$, $4b_3$ and $4b_4$, which vary in accordance with the variation of the magnetic field 3 generated by the multi-pole magnetized layer 53a, to thereby determine the rotational angle of the magnetic drum 53 at $\lambda/4$ pitch. An angle smaller than the pitch ($\lambda/4$) is determined according to an interpolative calculation. Throughout the specification, "pitch $\lambda$" refers to the pitch angle.

The eight magnetoresistor elements $4a_1$, $4a_2$, $4a_3$, $4a_4$, $4b_1$, $4b_2$, $4b_3$ and $4b_4$ can be divided into two groups, i.e., an A-phase and a B-phase which have a phase difference of $\lambda/4$ or $\lambda(3/4)$ therebetween. The four magnetoresistor elements $4a_1$, $4a_2$, $4a_3$ and $4a_4$ of the A-phase and the four magnetoresistor elements $4b_1$, $4b_2$, $4b_3$ and $4b_4$ of the B-phase are alternately arranged. The four magnetoresistor elements $4a_1$, $4a_2$, $4a_3$ and $4a_4$ of the A-phase are arranged at $\lambda/2$ intervals and the four magnetoresistor elements $4b_1$, $4b_2$, $4b_3$ and $4b_4$ of the B-phase are also arranged at $\lambda/2$ intervals.

Figure 4:
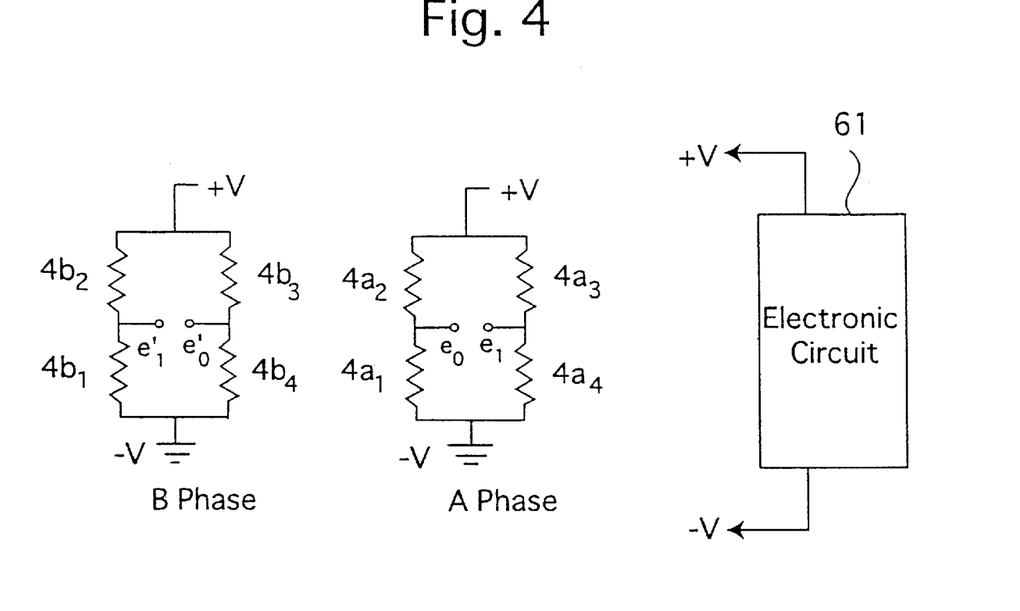
FIG. 4 is a schematic circuit diagram of an embodiment showing the electrical connection of magnetoresistor elements mounted on a magnetic sensor of the magnetic incremental rotary encoder shown in FIGS. 1 and 2.

As shown in FIG. 4, the four magnetoresistor elements $4a_1$, $4a_2$, $4a_3$ and $4a_4$ of the A-phase are connected in the form of a bridge circuit while the four magnetoresistor elements $4b_1$, $4b_2$, $4b_3$ and $4b_4$ of the B-phase are also connected in the form of a bridge circuit. An electronic circuit (shown in FIG. 6) applies constant voltages (+V and −V) between the terminals of each of the two bridge circuits. The electronic circuit detects a variation of the magnetic field, i.e., a variation of the angle of rotation of the magnetic drum 53 in accordance with the voltage across terminals $e_0$ and $e_1$ of the A-phase and the voltage across terminals $e_0'$ and $e_1'$ of the B-phase (see FIG. 4).

According to this illustrated embodiment, the respective resistance values $a_1$, $a_2$, $a_3$ and $a_4$ of the four magnetoresistor elements $4a_1$, $4a_2$, $4a_3$ and $4a_4$ of the A-phase vary in dependence on the variation of the magnetic field 3 generated by the rotation of the magnetic drum 53, in accordance with the following equations:

$$a_1 = R_0 + R\sin(N\omega)$$

$$a_2 = R_0 + R\sin(N\omega + \pi) = R_0 - R\sin(N\omega)$$

$$a_3 = R_0 + R\sin(N\omega + 2\pi) = R_0 + R\sin(N\omega)$$

$$a_4 = R_0 + R\sin(N\omega + 3\pi) = R_0 - R\sin(N\omega)$$

wherein "$\omega$" represents the angle of rotation of the magnetic drum 53, "$R_0$" represents the resistance value in the case of no magnetic field, "R" represents the resistance ratio (coefficient), and "N" represents the number of magnetized divisions of the multi-pole magnetized layer 53a.

The terminals $e_0$ and $e_1$ of the A-phase respectively output two sine wave signals (a SIN wave and a $\overline{\text{SIN}}$ wave) which have a phase difference of 180 degrees therebetween. The difference between these two sine wave signals is amplified to obtain a sine wave signal (i.e., "SIN signal").

The magnetoresistor elements $4b_1$, $4b_2$, $4b_3$ and $4b_4$ of the B-phase are respectively offset from the magnetoresistor elements $4a_1$, $4a_2$, $4a_3$ and $4a_4$ of the A-phase by $\pi/2$, so that the terminals $e_0'$ and $e_1'$ of the B-phase respectively output two cosine wave signals (a COS wave and a $\overline{\text{COS}}$ wave) which have a phase difference of 180 degrees. The difference between these two cosine wave signals is amplified to obtain a cosine wave signal (i.e., "COS signal") which has a phase difference of 90 degrees with respect to the aforementioned "SIN signal".

The angle of rotation of the magnetic drum 53 can be determined at a pitch of N/4 by detecting the zero crossing points of the outputs of the A-phase and the B-phase. Accordingly, the detection pitch is four times smaller than (i.e., a quarter of) the number of divisions N to realize a high resolution. In surveying instruments, a detection pitch which is smaller than a quarter of the number of divisions N is generally required, so that the number of magnetized divisions of the multi-pole magnetized layer 53a need to be greater than the number of divisions N. To this end, in the illustrated embodiment, the detection pitch is increased by performing an interpolative calculation such as the following:

$$\tan^{-1}(y/X)$$

wherein "x" represents the voltage of the A-phase, and "y" represents the voltage of the B-phase.

The structure of the second magnetic sensor 55 is identical to the structure of the first magnetic sensor 54.

The above discussed are the outlines of the total station 11 and the magnetic incremental rotary encoder 51 incorporated therein. The characteristics of the magnetic incremental rotary encoder 51, which is incorporated in the total station 11 shown in FIGS. 1 and 2, will be further discussed with reference to FIGS. 6 through 10.

First Embodiment

Figure 6:
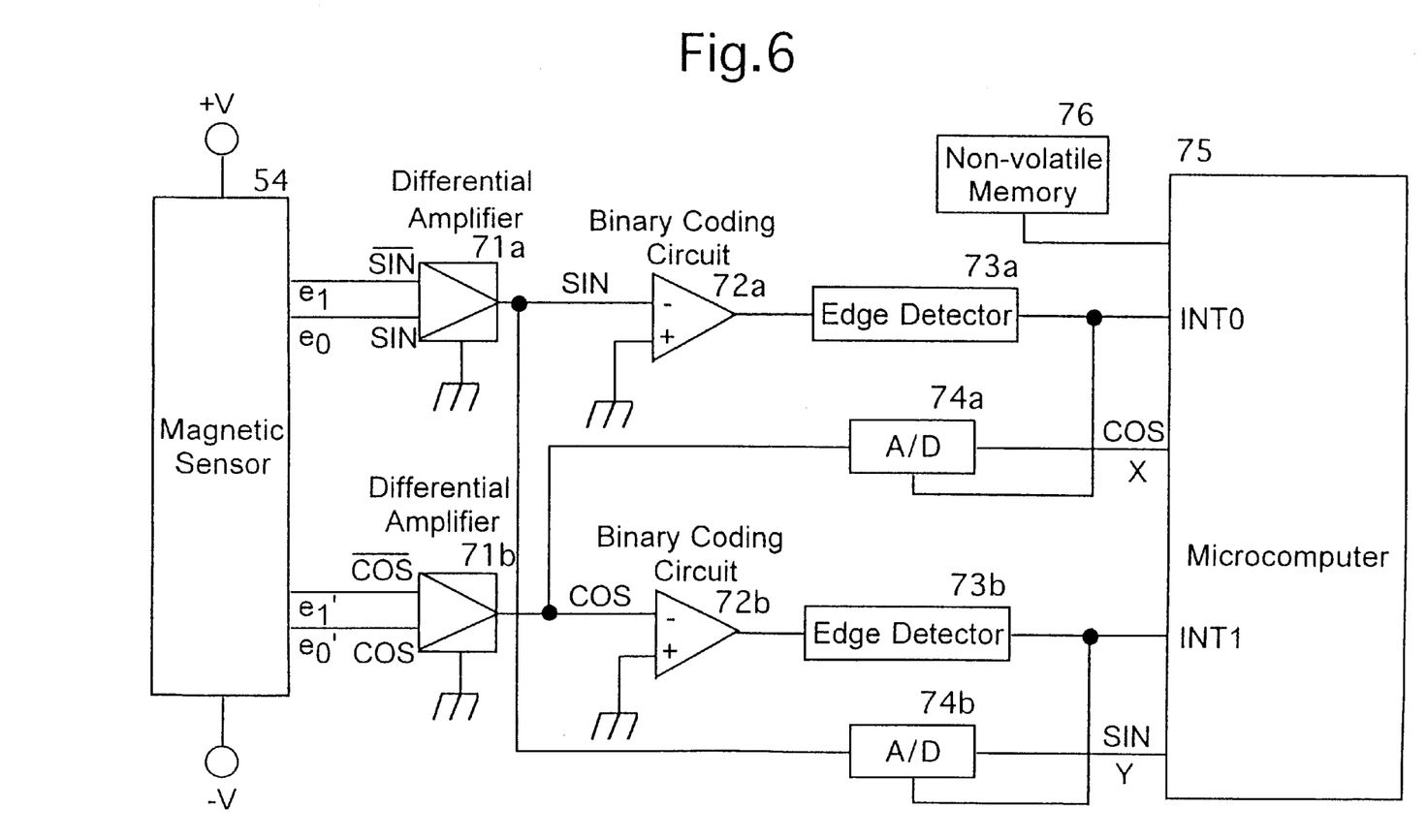
FIG. 6 is a block diagram of the first embodiment of an electronic circuit which is applied to the magnetic incremental rotary encoder to which the present invention is applied.
Figure 7:
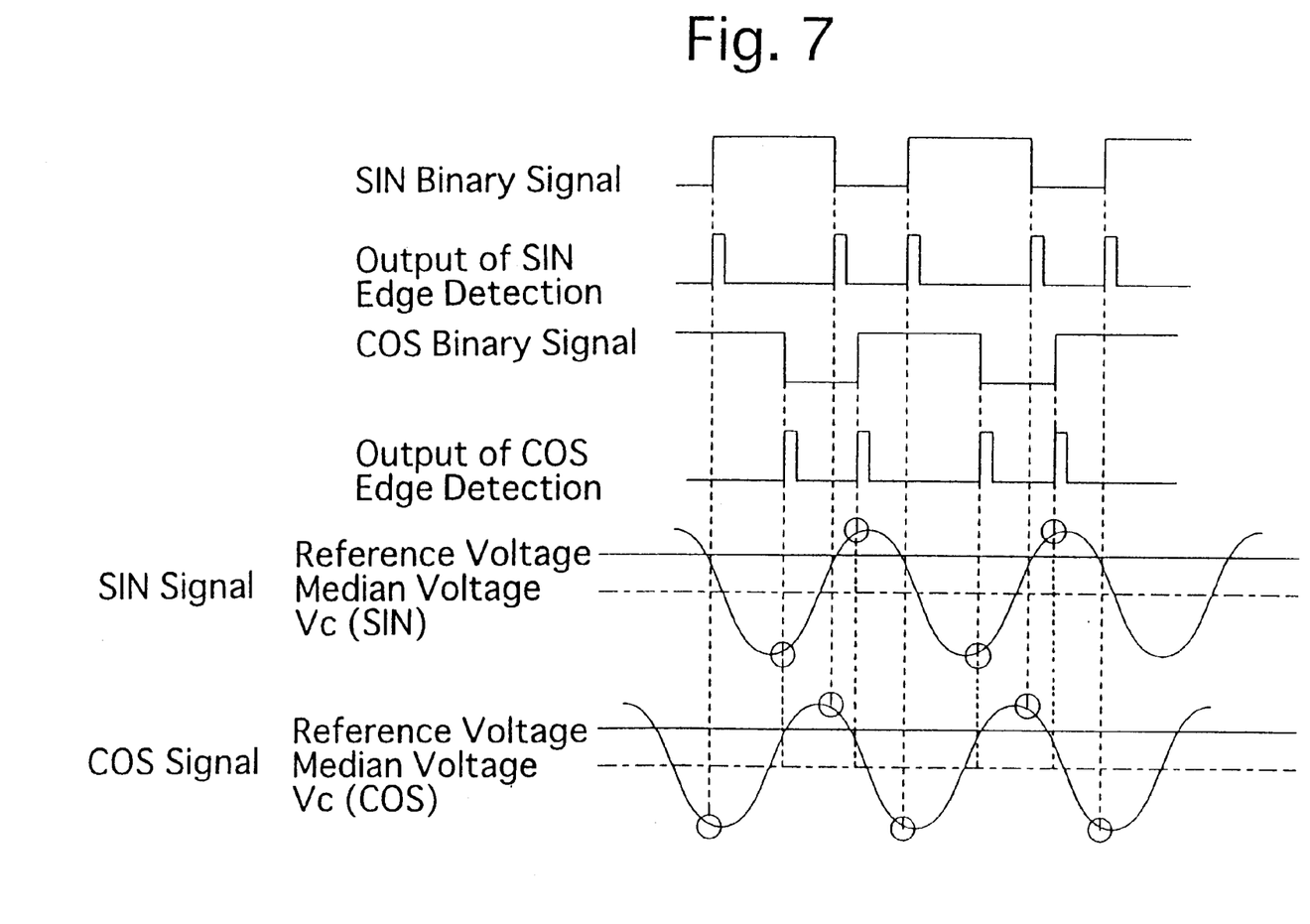
FIG. 7 is a time chart of the sine/cosine wave signals output from a magnetic sensor of the incremental rotary encoder shown in FIGS. 1 and 2, showing the timing of taking the output voltage of the magnetic sensor.

FIG. 6 shows a block diagram of the first embodiment of an electronic circuit which is applied to the magnetic incremental rotary encoder, and FIG. 7 is a time chart of the sine/cosine wave signals output from the first magnetic sensor 54, showing the timing of detection of the output voltage of the first magnetic sensor 54. The block diagram and time chart shown in FIGS. 6 and 7 for the first magnetic sensor 54 is identical to the second magnetic sensor 55.

The electronic circuit shown in FIG. 6 is provided with the first magnetic sensor 54, two differential amplifiers 71a and 71b, two binary-coding circuits 72a and 72b, two edge detectors 73a and 73b, two A/D converters 74a and 74b, a microcomputer (controller) 75 and a non-volatile memory (e.g., a flash memory) 76.

The electronic circuit 61 applies a constant voltage (+V and −V) between the terminals of the A-phase bridge circuit. If the magnetic drum 53 rotates, two sine wave signals (a SIN wave and a $\overline{\text{SIN}}$ wave) which have a phase difference of 180 degrees therebetween and oscillates at approximately zero volts as the center of the oscillation are output from the terminals $e_0$ and $e_1$ of the A-phase. The difference between these two sine wave signals is amplified through the differential amplifier 71a to thereby obtain a sine wave signal ("SIN signal" shown in FIG. 7) whose median voltage is approximately zero. This SIN Signal is compared with 0V (zero volts) by the binary-coding circuit 72a to be coded into a binary signal (high/low level signal).

Likewise, the electronic circuit 61 also applies a constant voltage (+V and −V) between the terminals of the B-phase bridge circuit, so that if the magnetic drum 53 rotates, two cosine wave signals (a COS wave and a $\overline{\text{COS}}$ wave) which have a phase difference of 90 degrees with respect to the aforementioned two sine wave signals (the SIN wave and the $\overline{\text{SIN}}$ wave) are output from the terminals $e_0'$ and $e_1'$ of the A-phase. The difference between the two cosine wave signals is amplified through the differential amplifier 71b to thereby obtain a cosine wave signal ("COS signal" shown in FIG. 7) whose median voltage is approximately zero. This COS signal is compared with 0V (zero volt) by the binary-coding circuit 72b to be coded into a binary signal (high/low level signal).

The edge detector 73a detects the point of variation of the binary signal from "0" to "1" or from "1" to "0" which is output from the binary coding circuit 72a to output a pulse signal (edge pulse). Likewise, the edge detector 73b detects the point of variation of the binary signal from "0" to "1" or from "1" to "0" which is output from the binary coding circuit 72b to output a pulse signal (edge pulse).

Thereafter, since the SIN signal and the COS signal have a phase difference of approximately 90 degrees therebetween, the voltage of the COS signal is detected at the moment of detection of the point of variation of the SIN binary signal, and at the same time, the voltage of the SIN signal is detected at the moment of detection of the point of variation of the COS binary signal, so as to detect an approximate peak voltage of each of the SIN signal and the COS signal. Namely, the voltage of the COS signal which is output from the differential amplifier 71b is converted into a corresponding digital numerical value (voltage value X) by the A/D converter 74a in response to an edge pulse output from the edge detector 73a. Likewise, the voltage of the SIN signal which is output from the differential amplifier 71a is converted into a corresponding digital signal (voltage value Y) by the A/D converter 74b in response to an edge pulse output from the edge detector 73b.

Upon detecting the pulse signal output from the edge detector 73a, the microcomputer 75 receives the digital numerical value of the COS signal (voltage value X) output from the A/D converter 74a. Likewise, upon detecting the pulse signal output from the edge detector 73b, the microcomputer 75 takes in the digital numerical value of the SIN signal (voltage value Y) output from the A/D converter 74b. The microcomputer 75 takes an even number of the voltage values Y and X (i.e., takes the voltage values Y and X an even number of times) therein to determine the median voltage $V_{C(SIN)}$ of the SIN signal and the median voltage $V_{C(COS)}$ of the COS signal, respectively, according to the following equations:

$$V_{C(SIN)}=(Y_1+Y_2+\ldots+Y_{2N-1}+Y_{2N})/2N \quad (3)$$

$$V_{C(COS)}=(X_1+X_2+\ldots+X_{2N-1}+X_{2N})/2N \quad (4)$$

Upon determining the median voltage $V_{C(SIN)}$ of the SIN signal and the median voltage $V_{C(COS)}$ of the COS Signal, the microcomputer 75 converts voltage values X and Y subsequently detected into voltage values x and y measured from the median voltage $V_{C(COS)}$ and the median voltage $V_{C(SIN)}$ respectively, using the following equations (1):

$$x=X-V_{C(COS)}, \text{ and}$$

$$y=Y-V_{C(SIN)}. \quad (1)$$

Thereafter, the interpolation value (interpolation rotational angle θ) is calculated in accordance with the converted voltage values x and y, using the following equation (2):

$$\theta=\tan^{-1}(y/x). \quad (2)$$

FIG. 7 shows an embodiment of the timing of the voltages of the COS signal and the SIN Signal, which are input into the microcomputer 75, at the point-of-detection of variation of the SIN binary Signal and the COS binary Signal, respectively. It will be appreciated from FIG. 7 that, in each of the SIN Signal and the COS Signal, the points of detection (indicated by small circles on each sine wave signal in FIG. 7) lie on the opposite sides of the median voltage of the wave signals to have the same absolute values, but having different signs (+ and −).

Figure 9:
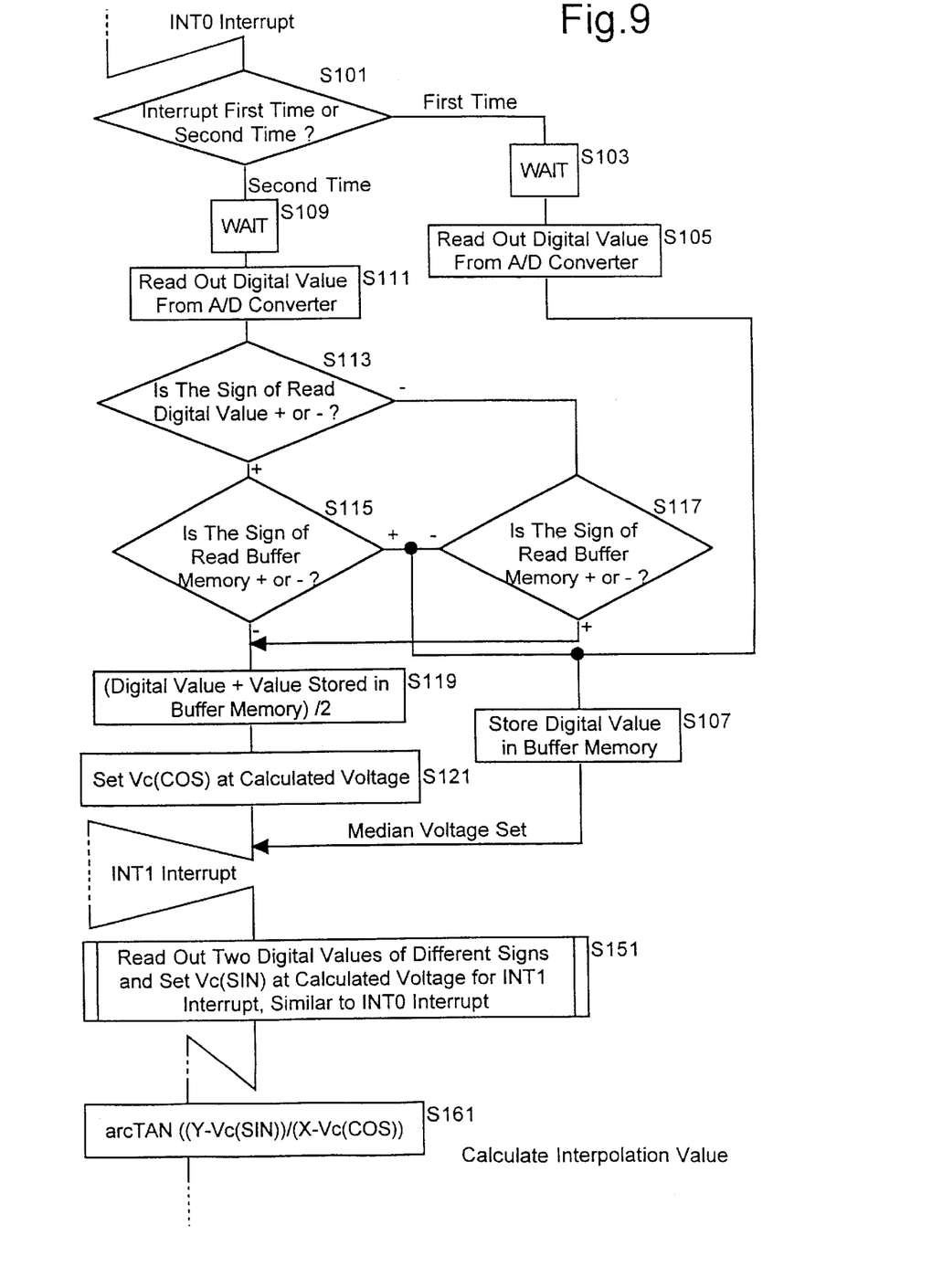
FIG. 9 is a flow chart showing the operation of the magnetic incremental rotary encoder which is applied to the first embodiment of the electronic circuit shown in FIG. 6.

The above-mentioned operations are performed by the microcomputer 75. FIG. 9 is a flow chart showing the operations, performed by the microcomputer 75, in the case where the microcomputer 75 takes in two digital numerical values of the COS signal output from the A/D converter 74a and takes in two digital numerical values of the SIN signal output from the A/D converter 74b. The microcomputer 75 functions as a voltage detector for detecting the voltages of the COS and SIN signals, and also functions as a calculator.

If an edge pulse is output from the edge detector 73a to enter an interrupt terminal INT0 of the microcomputer 75, control enters the operation at Step S101. At step S101 it is determined whether the edge pulse (interrupt) enters for the first time or the second time; if for the first time, control proceeds to step S103 at which control waits for a period of time which is necessary for the voltage of the COS signal, output from the differential amplifier 71b, to be converted into a corresponding digital value through the A/D converter 74a. Subsequently, the digital value is read out of the A/D converter 74a to be written in a buffer memory provided in the microcomputer 75 at steps S105 and S107. Subsequently, control waits for an edge pulse to enter the interrupt terminal INT0 or an interrupt terminal INT1 of the microcomputer 75.

If it is determined at step S101 that the edge pulse has entered the interrupt terminal INT0 for the second time, control proceeds to step S109, at which control waits for a period of time which is necessary for the voltage of the COS signal, output from the differential amplifier 71b, to be converted into a corresponding digital value through the A/D converter 74a. Subsequently, the digital value is read out from the A/D converter 74a at steps S111, and it is determined through steps S113, S115 and S117 whether the read digital value has the same sign (+ or −) as the digital value written in the buffer memory. If the read digital value has the same sign as in the buffer memory, the digital value written in the buffer memory is rewritten so as to be replaced by the read digital value (steps S113, S115 and S107, or steps S113, S117 and S107). Thereafter, control waits for the subsequent interrupt to enter the interrupt terminal INT0 or an interrupt terminal INT1. If the read digital value has the sign opposite to the sign of the digital value written in the buffer memory, i.e., if control proceeds from step S113 to step S115 or from step S113 to step S117, an average of the read digital value and the digital value written in the buffer memory is calculated at step S119. Subsequently, the median voltage $V_{C(COS)}$ of the COS signal is set at this calculated average value at step S121.

If an edge pulse is output from the edge detector 73b to enter an interrupt terminal INT1, operations similar to the operations at steps S101 through S121 are performed in the aforementioned manner to calculate an average of two digital values having different signs so as to set the median voltage $V_{C(SIN)}$ of the SIN signal at this calculated average value (step S151).

Upon determining the median voltage $V_{C(SIN)}$ of the SIN signal and the median voltage $V_{C(COS)}$ of the COS signal, control proceeds to step S161 at which voltage values X and Y subsequently detected are converted into voltage values x and y measured from the median voltage $V_{C(COS)}$ and the median voltage $V_{C(SIN)}$, respectively, using the following equations (1)

$$x = X - V_{C(COS)}, \text{ and}$$
$$y = Y - V_{C(SIN)}. \tag{1}$$

and subsequently the interpolation value (interpolation rotational angle θ) is calculated in accordance with the converted voltage values x and y, using the following equation (2):

$$\theta = \tan^{-1}(y/x). \tag{2}$$

As can be understood from the foregoing, according to the first embodiment, the median voltages of the SIN and COS signals output from the magnetic incremental rotary encoder in accordance with the rotational movement thereof are determined, and subsequently the interpolation value (interpolation rotational angle θ) is calculated using a difference in voltage between the median voltage Vhd C(SIN) of the SIN signal and the detected voltage of the SIN signal and a difference in voltage between the median voltage $V_{C(COS)}$ of the COS signal and the detected voltage of the COS signal, so that the interpolation value is calculated with high precision.

In the first embodiment, the values of the median voltages of the SIN and COS signals $V_{C(SIN)}$ and $V_{C(COS)}$, which are determined when total station 11 is in operation, can be stored in the non-volatile memory 76 when the power is shut OFF; and when the power is turned ON, the stored values of the median voltages can be read out of the non-volatile memory 76 to calculate the interpolation value.

Moreover, in the first embodiment, it is possible for the median voltages of the SIN and COS signals $V_{C(SIN)}$ and $V_{C(COS)}$ to be determined when the user desires or when the power of the total station 11 is turned ON. The values of these determined median voltages may be stored in the non-volatile memory 76 and read out each time they are used. According to this manner of storing the values of the determined median voltages in the non-volatile memory 76 and using the same by reading out from the non-volatile memory 76, the interpolation value can always be calculated with high precision with less calculation time.

Furthermore, although the duty cycle of the binary signal is generally set at fifty percent, even if the duty cycle of the binary code deviates from fifty percent, no problems occur since the median voltages of the SIN and COS signals $V_{C(SIN)}$ and $V_{C(COS)}$ can be determined.

Second Embodiment

Figure 8:
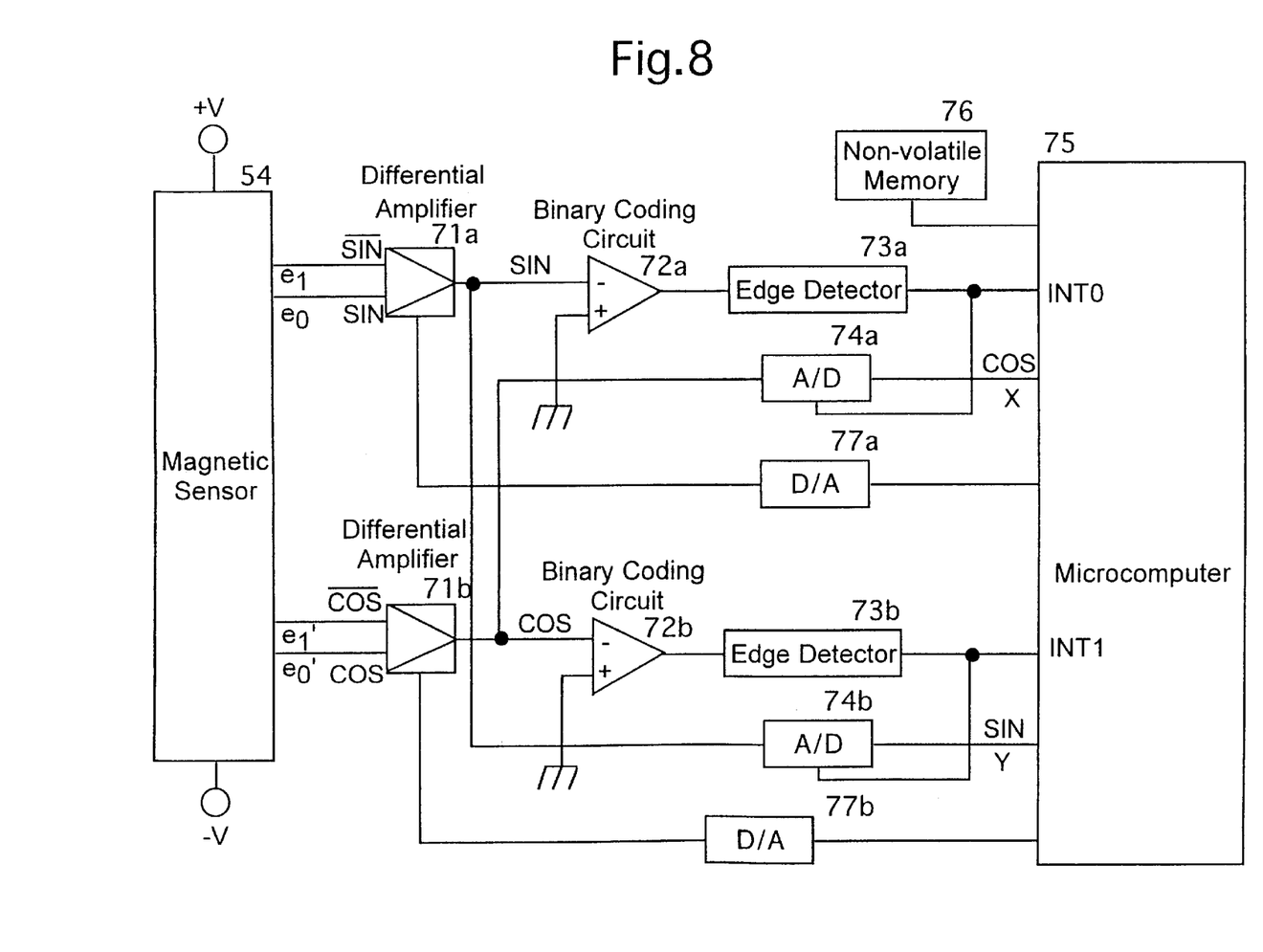
FIG. 8 is a block diagram of the second embodiment of an electronic circuit which is applied to the magnetic incremental rotary encoder to which the present invention is applied.

FIG. 8 shows a block diagram of the second embodiment of an electronic circuit which is applied to the magnetic incremental rotary encoder. The second embodiment is characterized in that the offset voltages of the differential amplifiers 71a and 71b (the terminal voltages at the offset terminals of the differential amplifiers 71a and 71b) are adjusted so that the median voltage $V_C$ coincides with a predetermined reference voltage. The basic structure of the electronic circuit of the second embodiment is the same as that of the first embodiment, so that only the structure of the electronic circuit which is different from that of the first embodiment will be hereinafter discussed.

In addition to the fundamental elements of the first embodiment of the electronic circuit shown in FIG. 6, the second embodiment of the electronic circuit is further provided with two D/A converters 77a and 77b. The offset terminals of the differential amplifiers 71a and 71b are connected to the microcomputer 75 via the D/A converters 77a and 77b, respectively.

The median voltage $V_C$ ($V_{C(SIN)}$ or $V_{C(COS)}$), which is determined in the same manner as that in the first embodiment, is compared with a predetermined target voltage $V_{CONST}$ which is stored in advance in the non-volatile memory 76 for calculating the difference therebetween (i.e., a voltage difference $V_{OFFSET}$) using the following equation:

$$V_{OFFSET} = V_C - V_{CONST}.$$

The offset voltages of the differential amplifiers 71a and 71b which are output from the microcomputer 75 to be input in the D/A converters 77a and 77b, respectively (namely, the output values of the D/A converters 77a and 77b which are input in the offset terminals of the differential amplifiers 71a and 71b, respectively) are adjusted in accordance with the absolute value of the voltage difference $V_{OFFSET}$ and the sign (+ or −) thereof so that the voltage difference $V_{OFFSET}$ becomes zero.

In such a manner, the microcomputer 75 adjusts the median voltage $V_C$ to be equal to the target voltage $V_{CONST}$, by means of applying voltages (the offset voltages) to the offset terminals of the differential amplifiers 71a and 71b (i.e., by means of a negative feedback) so that the voltage difference $V_{OFFSET}$, calculated using the aforementioned equation ($V_{OFFSET} = V_C - V_{CONST}$) becomes zero. The microcomputer 75 and the D/A converters 77a and 77b form a closed-loop circuit.

In this second embodiment, if the voltages of the two sine wave signals of the SIN and COS signals are respectively represented by "X" and "Y" and if the target voltages of the two sine wave signals are respectively represented by "$V_{CONST(COS)}$" and "$V_{CONST(SIN)}$", can be represented by the following equations (1–2):

$$x = X - V_{CONST(COS)}, \text{ and}$$

$$y = Y - V_{CONST(SIN)} \quad (1\text{–}2)$$

wherein "x" represents the voltage measured from the target voltages "$V_{CONST(COS)}$", and "y" represents the voltage measured from the target voltages "$V_{CONST(SIN)}$".

Accordingly, the interpolation value (interpolation rotational angle θ) is calculated by the following equation (2):

$$\theta = \tan_{-1}(y/x). \quad (2)$$

If each of the target voltages $V_{CONST(COS)}$ and $V_{CONST(SIN)}$ is set to be equal to the corresponding reference voltage $V_{ref(COS)}$ or $V_{ref(SIN)}$ (the voltage applied to the plus terminal of the binary-coding circuit 72a or 72b), each of the two sine wave signals of the SIN and COS signals will be coded into a binary signal with reference to the median voltage thereof. Therefore, the duty of the binary signal output from each of the binary coding circuit 72a and 72b can be maintained at fifty percent.

Figure 10:
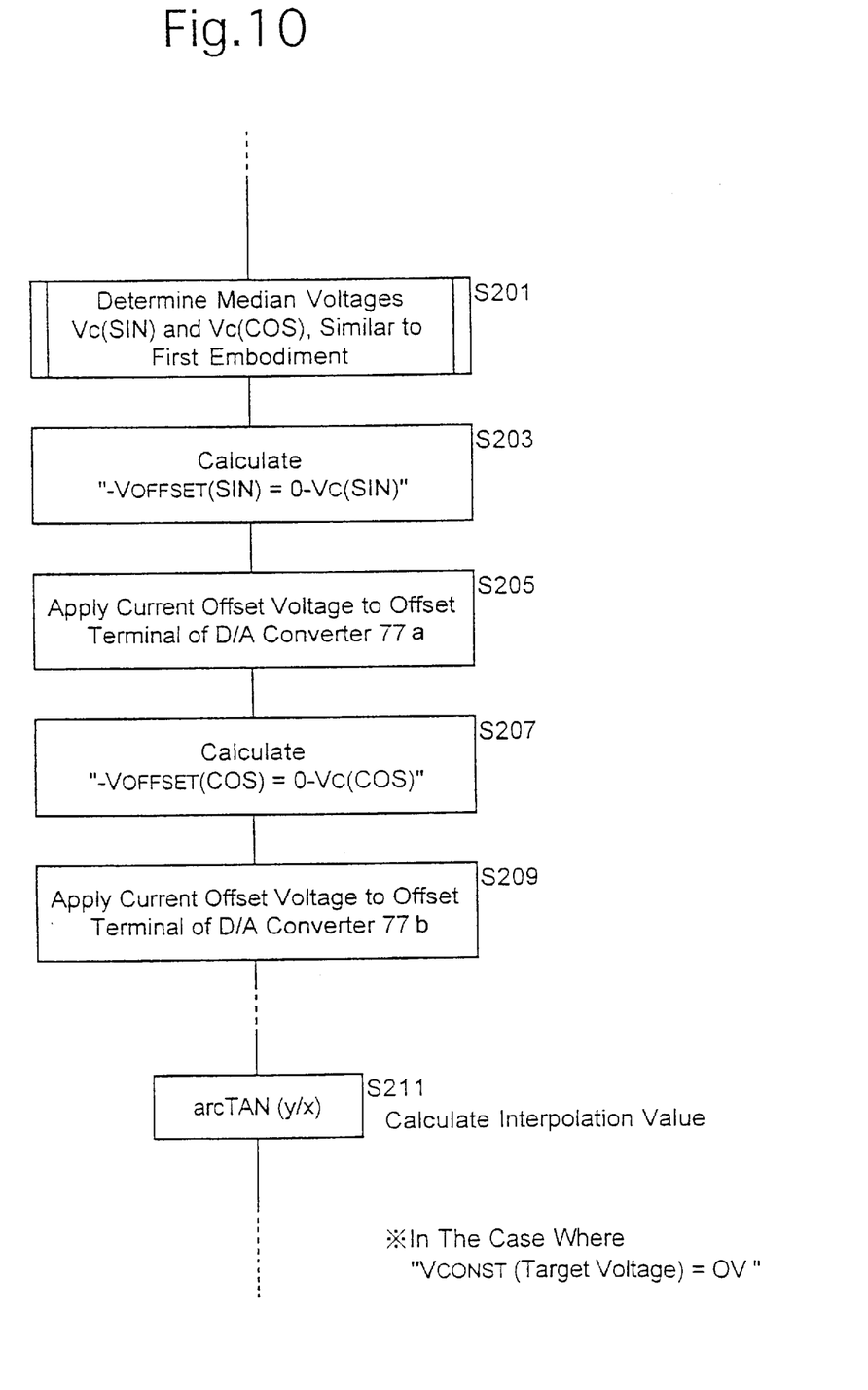
FIG. 10 is a flow chart showing the operation of the magnetic incremental rotary encoder which is applied to the second embodiment of the electronic circuit shown in FIG. 8.

The operation of setting the target voltages and the operation of calculating the interpolation value are performed by the microcomputer 75. FIG. 10 is a flow chart showing such operations performed by the microcomputer 75.

Firstly, operations similar to the operations at steps S101 through S121 and 151 of the first embodiment shown in FIG. 9 are performed to determine the median voltage $V_{C(COS)}$ and the median voltage $V_{C(SIN)}$ at step S201. Upon determining the median voltage $V_{C(SIN)}$ of the SIN signal and the median voltage $V_{C(COS)}$ of the COS signal, control proceeds to step S203 at which a difference between the median voltage $V_{C(SIN)}$ and the target voltage $V_{CONST(SIN)}$ prestored in the non-volatile memory 76 (i.e., a voltage difference $V_{OFFSET(SIN)}$) is calculated using the following equation:

$$-V_{OFFSET(SIN)} = 0 - V_{CONST(SIN)}$$

In this second embodiment each of the target voltages $V_{CONST(SIN)}$ and $V_{CONST(COS)}$ is set at zero volt (0V).

Subsequently, control proceeds to step S205 at which the voltage "$-V_{OFFSET(SIN)}$" (the digital offset voltage) is converted into a corresponding analogue offset voltage through the D/A converter 77a to be applied to the offset terminal of the differential amplifier 71a.

Subsequently, control proceeds to step S207 at which the difference between the median voltage $V_{C(COS)}$ and the target voltage $V_{CONST(COS)}$ prestored in the non-volatile memory 76 (i.e., a voltage difference $V_{OFFSET(COS)}$) is calculated using the following equation:

$$-V_{OFFSET(COS)} = 0 - V_{CONST(COS)}$$

Subsequently, control proceeds to step S209 at which the voltage "$-V_{OFFSET(COS)}$" (the digital offset voltage) is converted into a corresponding analogue offset voltage through the D/A converter 77b to be applied to the offset terminal of the differential amplifier 71b.

After the above two analogue offset voltages are respectively applied to the offset terminals of the differential amplifiers 71a and 71b, control proceeds to step S211 at which voltage values X and Y subsequently detected are converted into voltage values x and y measured from the target voltage $V_{CONST(COS)}$ and $V_{CONST(SIN)}$, respectively, and subsequently the interpolation value (interpolation rotational angle θ) is calculated in accordance with the converted voltage values x and y.

As can be understood from the foregoing, according to the second embodiment, the median voltage of each of the SIN and COS signals output from the magnetic incremental rotary encoder in accordance with the rotational movement thereof can be made coincident with the corresponding target voltage $V_{CONST(SIN)}$ or $V_{CONST(COS)}$, the interpolation value is calculated with high precision. Furthermore, by making each of the target voltages $V_{CONST(SIN)}$ and $V_{CONST(COS)}$ equal to the voltage applied to the reference voltage terminal (plus terminal) of the binary-coding circuit 72a or 72b, the duty cycle of the binary signal output from each of the binary coding circuit 72a and 72b can be maintained at fifty percent.

In the second embodiment of the electronic circuit, the values of the offset voltages which make the voltage differences $V_{OFFSET(SIN)}$ and $V_{OFFSET(COS)}$ zero (calculated using the values of the median voltage $V_C$ and the target voltage $V_{CONST}$), in the non-volatile memory 76 when the power is shut OFF; and thereafter the stored values of the offset voltages can be read out of the non-volatile memory 76 to be input in the D/A converter 77a and 77b so as to adjust the offset voltages. This makes it possible to calculate the interpolation value (interpolation rotational angle θ) with high precision.

Moreover, in the second embodiment, it is possible that the values of the offset voltages be determined when the user desires or when the power of the total station 11 is turned ON. The values of the offset voltages may be stored in the non-volatile memory 76 and read out each time they are used. According to this manner of storing the determined values of the offset voltages in the non-volatile memory 76 and using these determined values when the total station 11 is in operation by reading out from the non-volatile memory 76, the interpolation value can always be calculated with high precision and with less calculation time.

As can be seen from the above discussion, according to the illustrated embodiments to which the present invention is applied, the precision in calculating the interpolation value can be increased. Therefore, in a magnetic incremental rotary encoder which generally has less number of the magnetized divisions of the magnetic drum as compared with an optical incremental rotary encoder, the display resolution and the accuracy of the magnetic incremental rotary encoder can be improved.

As can be understood from the foregoing, according to the illustrated embodiments to which the present invention is applied, the median voltage of each of the two sine/cosine wave signals having a phase difference of 90 degrees therebetween which are output from the rotary encoder when the rotary encoder is in operation is determined, and subsequently an interpolation rotational angle for said incremental rotary encoder is calculated. This makes it possible to calculate the interpolation value (interpolation rotational angle θ) with high precision.

Furthermore, the median voltage of each of the two sine/cosine wave signals having a phase difference of 90 degrees therebetween which are output from the rotary encoder in accordance with the rotational movement thereof can be made coincident with the corresponding target voltage $V_{CONST(SIN)}$ or $V_{CONST(COS)}$, so that the interpolation value is calculated with high precision by performing an interpolative calculation.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An incremental rotary encoder which outputs two sine wave signals having a phase difference of 90 degrees when said incremental rotary encoder is in operation, said incremental rotary encoder comprising:

a binary coding circuit which codes each of said two sine wave signals into a binary signal;

a voltage detector which detects the voltage of one of said two sine wave signals at the moment of variation in a signal level of said binary signal of the other of said two sine wave signals; and a controller comprising a calculator which takes an even number of voltage values detected by said voltage detector to generate an average of said even number of voltage values for each of said two sine wave signals.

2. The incremental rotary encoder according to claim 1, wherein said calculator calculates a median voltage of each of said two sine wave signals in accordance with said average of said even number of voltage values, and performs an interpolative calculation in accordance with said detected voltage and said median voltage to calculate an interpolation rotational angle for said incremental rotary encoder.

3. The incremental rotary encoder according to claim 2, wherein said calculator performs said interpolative calculation using the following equations (1) and (2):

$x = X - V_{C(COS)}$ and
$y = Y - V_{C(SIN)}$ ... (1);
$\theta = \tan^{-1}(y/x)$ ... (2);

wherein "X" and "Y" designate the voltages of said two sine wave signals of the SIN and COS signals, respectively;

"$V_C$" designates the medium voltage; and

"θ" represents said interpolation rotational angle.

4. The incremental rotary encoder according to claim 3, further comprising a non-volatile memory;

wherein said median voltages $V_{C(SIN)}$ and $V_{C(COS)}$ are stored in advance in said non-volatile memory; and wherein said controller reads out said stored values of said median voltages $V_{C(SIN)}$ and $V_{C(COS)}$ from said non-volatile memory to perform said interpolative calculation.

5. The incremental rotary encoder according to claim 1, further comprising:

a rotary portion;

a sensor which outputs two sine wave signals having a phase difference of 180 degrees with respect to each respective said two sine wave signals having a phase difference of 90 degrees; and a differential amplifier which amplifies a difference between said two sine wave signals having said phase difference of 180 degrees.

6. The incremental rotary encoder according to claim 1, further comprising:

a magnetic drum; and first and second magnetic sensors arranged so as to be opposite from each other with respect to the axis of said magnetic drum.

7. An incremental rotary encoder which outputs two sine wave signals having a phase difference of 90 degrees when said incremental rotary encoder is in operation, said incremental rotary encoder comprising:

a binary coding circuit which codes each of said two sine wave signals into a binary signal;

a voltage detector which detects the voltage of one of said two sine wave signals at the moment of variation in a signal level of said binary signal of the other of said two sine wave signals;

a controller comprising a calculator which takes an even number of voltage values detected by said voltage detector to generate an average of said even number of voltage values for each of said two sine wave signals;

a closed-loop circuit which compares said average voltage with a predetermined target voltage to bring said average voltage close to said predetermined target voltage.

8. The incremental rotary encoder according to claim 7, further comprising:

a rotary portion;

a sensor which outputs two sine wave signals having a phase difference of 180 degrees with respect to each respective said two sine wave signals having a phase difference of 90 degrees; and a differential amplifier which amplifies a difference between said two sine wave signals having said phase difference of 180 degrees;

wherein said closed-loop circuit adjusts an offset voltage of said differential amplifier so that said average voltage coincides with said predetermined target voltage.

9. The incremental rotary encoder according to claim 8, further comprising a non-volatile memory;

wherein said adjusted offset voltage is stored in advance in said non-volatile memory when the power is OFF; and wherein said controller reads out said stored offset voltage from said non-volatile memory to adjust said voltage values X and Y, detected by said voltage detector, when the power is ON.

10. A surveying instrument comprising:

a leveling board;

a pedestal coupled to said leveling board to be rotatable about a vertical axis relative to said leveling board;

a collimating telescope coupled to said pedestal to be rotatable about a horizontal axis relative to said pedestal;

a horizontal-angle measuring device for measuring an angle of rotation of said pedestal relative to said leveling board; and a vertical-angle measuring device for measuring an angle of rotation of said collimating telescope relative to said pedestal;

wherein at least one of said horizontal-angle measuring device and said vertical-angle measuring device comprises an incremental rotary encoder;

wherein said incremental rotary encoder comprises a rotary portion, a first sensor and a second sensor; said first and second sensors being arranged so as to be opposite from each other with respect to the axis of said rotary portion;

wherein said incremental rotary encoder outputs two sine wave signals having a phase difference of 90 degrees when said incremental rotary encoder is in operation, said incremental rotary encoder comprising:

a binary coding circuit which codes each of said two sine wave signals into a binary signal;

a voltage detector which detects the voltage of one of said two sine wave signals at the moment of variation in a signal level of said binary signal of the other of said two sine wave signals; and a calculator which takes an even number of voltage values from each of said two sine wave signals to take an average of said even number of voltage values for each of said two sine wave signals.

\* \* \* \* \*

UNITED STATES PATENT AND TRADEMARK OFFICE
CERTIFICATE OF CORRECTION

PATENT NO.    : 6,304,079 B1
DATED         : October 16, 2001
INVENTOR(S)   : Katsuhiko Kenjo et al.

It is certified that error appears in the above-identified patent and that said Letters Patent is hereby corrected as shown below:

<u>Title page,</u>
Item [73], Assignee, insert: -- and Asahi Seimitsu Kabushiki Kaisha, Tokyo (JP) --

Signed and Sealed this

Seventh Day of May, 2002

Attest:

Attesting Officer

JAMES E. ROGAN
*Director of the United States Patent and Trademark Office*